US012264229B2

(12) United States Patent
Kimura et al.

(10) Patent No.: US 12,264,229 B2
(45) Date of Patent: Apr. 1, 2025

(54) RESIN COMPOSITION, RESIN CURED PRODUCT, AND COMPOSITE MOLDED BODY

(71) Applicant: Mitsubishi Chemical Corporation, Tokyo (JP)

(72) Inventors: Akinori Kimura, Tokyo (JP); Toshiyuki Tanaka, Tokyo (JP); Dao Thi Kim Phuong, Tokyo (JP); Tomoki Kato, Tokyo (JP); Toshiyuki Sawamura, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 17/206,389

(22) Filed: Mar. 19, 2021

(65) Prior Publication Data

US 2021/0206943 A1 Jul. 8, 2021

Related U.S. Application Data

(63) Continuation of application No. PCT/JP2019/039448, filed on Oct. 7, 2019.

(30) Foreign Application Priority Data

Oct. 11, 2018 (JP) .................. 2018-192691

(51) Int. Cl.
*C08K 3/38* (2006.01)
*C08K 5/3492* (2006.01)
*H01L 23/373* (2006.01)

(52) U.S. Cl.
CPC .............. *C08K 3/38* (2013.01); *C08K 5/3492* (2013.01); *C08K 2003/385* (2013.01); *H01L 23/3737* (2013.01)

(58) Field of Classification Search
CPC ................................................ C08L 63/00–10
See application file for complete search history.

(56) References Cited

U.S. PATENT DOCUMENTS

| | | | | |
|---|---|---|---|---|
| 5,075,159 A | * | 12/1991 | Koyama | ................. H01B 3/40 428/209 |
| 2014/0030848 A1 | | 1/2014 | Ikemoto et al. | |
| 2015/0037575 A1 | | 2/2015 | Sakaguchi et al. | |
| 2016/0272808 A1 | | 9/2016 | You et al. | |

FOREIGN PATENT DOCUMENTS

| | | | |
|---|---|---|---|
| CN | 104220533 A | | 12/2014 |
| JP | 2003-342350 A | | 12/2003 |
| JP | 2006176658 A | * | 7/2006 |
| JP | 2006-257400 A | | 9/2006 |
| JP | 2011-241245 A | | 12/2011 |
| JP | 2012-136689 A | | 7/2012 |
| JP | 2013-145840 A | | 7/2013 |
| JP | 2013-151672 A | | 8/2013 |
| JP | 2013-221120 A | | 10/2013 |
| JP | 2015-006980 A | | 1/2015 |
| JP | 2015-067816 A | | 4/2015 |
| JP | 2015-189884 A | | 11/2015 |
| JP | 2016-536403 A | | 11/2016 |
| JP | 2016-219619 A | | 12/2016 |
| JP | 2017-036415 A | | 2/2017 |
| KR | 10-2014-0111302 | | 9/2014 |
| TW | 201348424 A | | 12/2013 |

OTHER PUBLICATIONS

Machine translation of JP2011241245 (Year: 2011).*
Machine translation of JP2017036415 (Year: 2017).*
Machines translation of JP-2006176658-A (Year: 2006).*
Extended European Search Report issued Oct. 15, 2021 in European Patent Application No. 19871054.3, 9 pages.
International Search Report issued Dec. 17, 2019 in PCT/JP2019/039448 filed on Oct. 7, 2019, 2 pages.
Combined Chinese Office Action and Search Report issued Jan. 10, 2022 in Chinese Patent Application No. 201980063537.3 (with English translation), 19 pages.
Combined Chinese Office Action and Search Report issued Jul. 7, 2022 in Chinese Patent Application No. 201980063537.3 (with unedited computer generated English translation), citing documents 15, 24 and 25 therein, 32 pages.
Shao-Ping, R., et al., "Effects of the Chemical Structure Changes on Phase Behavior: Thermal and Mechanical Properties of Rigid Rod Epoxy Resins", China Academic Journal Electronic Publishing House, vol. 28, No. 1, Jan. 31, 2007, pp. 159-163 (with English abstract).
Hooke, et al., New Polymer Synthesis and Preparation Processes, The Common Knowledge Evidence, Hallitar Industrial University Press, 1st Edition, May 31, 2014, pp. 7-8 with cover page.
Foreign Office Action issued May 9, 2023, in Japanese Patent Application No. 2020-551138 (w/ English machine translation).
Office Action issued Dec. 1, 2022, in Chinese Patent Application No. 201980063537.3 (w/ English machine translation).
Office Action issued Sep. 12, 2023. in corresponding Japanese Patent Application No. 2020-551138 (with English Translation), 6 pages.

(Continued)

*Primary Examiner* — Wenwen Cai

(74) *Attorney, Agent, or Firm* — Oblon, McClelland, Maier & Neustadt, L.L.P.

(57) ABSTRACT

A resin composition comprising a resin and an aggregated inorganic filler, wherein an increase in a weight of a cured product of the resin composition at 85° C. and 85% RH is 0.80% or less, and wherein a storage modulus of a cured product of the resin composition excluding the inorganic filler at 200° C. is $1.0 \times 10^7$ Pa or more. The resin composition has a high strength and excellent moisture-absorption reflow resistance and reduces the risk of the interfacial detachment being caused by the heat expansion and contraction in the case where the resin composition or the resin cured product is combined with a metal sheet to form a multilayer body.

10 Claims, No Drawings

(56) References Cited

OTHER PUBLICATIONS

Taiwanese Office Action issued on Jul. 17, 2023 in Taiwanese Patent Application No. 108136587 (with English translation), 17 pages.
Office Action issued Dec. 12, 2023, in corresponding Japanese Patent Application No. 2020-551138 (with English-language Translation).
Office Action received on Nov. 1, 2024, in the corresponding Korean application 10-2021-7008319 (with machine translation).
Office Action issued on Feb. 18, 2025, in corresponding European Patent Application No. 19871054.3.

* cited by examiner

RESIN COMPOSITION, RESIN CURED PRODUCT, AND COMPOSITE MOLDED BODY

TECHNICAL FIELD

The present invention relates to a resin composition, a resin cured product, and a composite molded body including a cured product part composed of a cured product of the resin composition and a metal part.

The resin composition, resin cured product, and composite molded body according to the present invention may be suitably used as, for example, a heat dissipation sheet for power semiconductor devices.

BACKGROUND ART

Power semiconductor devices, which have been used in various fields such as railroads, automobiles, and common electrical household appliances, are shifting from conventional Si power semiconductors to power semiconductors including SiC, AlN, GaN, or the like for further reductions in size and cost, an increase in efficiency, and the like.

In general, power semiconductor devices are used in the form of power semiconductor modules, which are produced by arranging plural semiconductor devices on a common heat sink and performing packaging.

Various issues of using the above power semiconductor devices in practical use have been pointed out. One of the issues is the dissipation of the heat produced from the devices. This issue affects the reliability of power semiconductor devices, which are commonly operated at high temperatures in order to increase output and density. There has been a concern about degradation of reliability caused by the heat produced due to the switching of the devices.

The heat generation caused as a result of an increase in the density of an integrated circuit has been a great issue particularly in the field of electrical and electronic engineering. Thus, it has been an urgent issue to determine how to dissipate the heat.

One of the approaches to addressing the above issue is to use a ceramic substrate having a high thermal conductivity, such as an alumina substrate or an aluminum nitride substrate, as a heat dissipation substrate on which the power semiconductor devices are disposed. However, ceramic substrates have shortcomings: ceramic substrates are likely to crack upon impact, and it is difficult to form thin-film ceramic substrates, which makes it difficult to achieve size reduction.

Accordingly, there has been proposed a heat dissipation sheet that includes a resin such as a highly thermal conductive epoxy resin and a highly thermal conductive inorganic filler. For example, PTL 1 proposes a heat dissipation resin sheet that includes a resin having a Tg of 60° C. or less and a boron nitride filler, wherein the content of the boron nitride filler is 30 vol % or more and 60 vol % or less.

However, applying the heat dissipation resin sheet composed of an inorganic filler-containing resin composition, which is known in the related art, to power semiconductors may result in the following issues.

(1) Since a large current flows through a power semiconductor at high voltages, it is important that power semiconductors have certain voltage resistance. However, the heat dissipation resin sheets known in the related art do not have voltage resistance sufficient for power semiconductor application.

(2) In the case where the heat dissipation resin sheet is bonded to a substrate, such as a copper foil, to form a multilayer heat dissipation sheet in order to increase thermal conductivity, interfacial detachment is likely to occur due to heat expansion and contraction caused by a large amount of heat produced during use.

In the case where a ceramic substrate is used, the interfacial detachment is less likely to occur because the integration is performed by sintering the substrate together with the copper plate. On the other hand, in the case where the heat dissipation resin sheet is used, the interfacial detachment is more likely to occur because the integration is performed by bonding the cured film to the foil by thermocompression bonding.

One of the possible approaches to preventing the interfacial detachment caused due to expansion and contraction is to increase the degree of crosslinking of the epoxy resin and thereby increase the strength of the cured product. For increasing the degree of crosslinking, it is necessary to increase the epoxy equivalent weight of the epoxy resin. In such a case, the addition reaction between the epoxy group of the epoxy resin and active hydrogen increases hydroxyl group concentration and moisture absorptivity may be increased with the increase in the hydroxyl group concentration. The increase in the moisture absorptivity of the epoxy resin results in the degradation of the insulating property of the cured product and the degradation of voltage resistance under a high-temperature high-humidity condition. Therefore, the above approach has been considered unfavorable.

The process for manufacturing a power semiconductor module includes a reflow soldering step. In the reflow soldering step, the members are quickly heated in order to melt the solder and join the metal members to one another. The reflow step causes the degradation of the members included in the module, which results in detachment at the interface between the cured product and metal, the degradation of insulating property, etc. This leads to the degradation of the reliability of the power semiconductor module. Furthermore, the members absorb moisture prior to the reflow step during storage. The moisture absorption of the members significantly accelerates the degradation of the members in the reflow soldering step. This may further degrade the performance of the power semiconductor module.

PTL 1: JP 2017-36415 A

SUMMARY OF INVENTION

An object of the present invention is to provide a resin composition and a resin cured product that have a high strength and excellent moisture-absorption reflow resistance and reduce the risk of the interfacial detachment being caused by the heat expansion and contraction in the case where the resin composition or the resin cured product is combined with a metal sheet to form a multilayer body and a composite molded body produced using the resin composition.

Solution to Problem

The inventor of the present invention found that a resin cured product composed of a resin composition including an aggregated inorganic filler, wherein the increase in the weight of a cured product of the resin composition at 85° C. and 85% RH is 0.80% or less and the storage modulus of a cured product of the resin composition excluding the inorganic filler at 200° C. is $1.0 \times 10^7$ Pa or more, has a high insulating property after a moisture-absorption reflow test, in which the resin cured product is stored under a high-temperature high-humidity condition and subsequently subjected to a reflow test (hereinafter, this property may be referred to as "moisture-absorption reflow resistance"), and is capable of addressing the issue of the interfacial detachment.

The inventor of the present invention also found that the use of a resin cured product having a certain storage modulus and a certain weight increase that fall within the respective specific ranges may enhance moisture-absorption reflow resistance to an excellent level and address the issue of the interfacial detachment.

The summary of the present invention is as follows.

Advantageous Effects of Invention

[1] A resin composition comprising a resin and an aggregated inorganic filler,
wherein an increase in a weight of a cured product of the resin composition at 85° C. and 85% RH is 0.80% or less, and
wherein a storage modulus of a cured product of the resin composition excluding the inorganic filler at 200° C. is $1.0 \times 10^7$ Pa or more.

[2] The resin composition according to [1], comprising an epoxy resin including three or more epoxy groups per molecule.

[3] The resin composition according to [1] or [2], comprising an epoxy resin having a weight-average molecular weight of 10,000 or more, the epoxy resin including a biphenyl structure.

[4] The resin composition according to [3], wherein the epoxy resin having a weight-average molecular weight of 10,000 or more, the epoxy resin including a biphenyl structure, further includes at least one structure selected from a structure represented by Structural Formula (1) below and a structure represented by Structural Formula (2) below.

[Chem. 1]

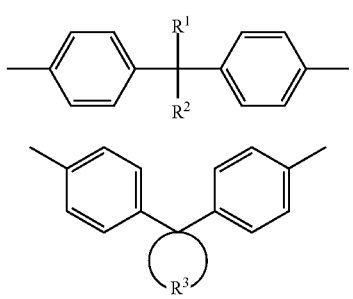

(wherein, in Formula (1), $R^1$ and $R^2$ each represent an organic group and, in Formula (2), $R^3$ represents a divalent cyclic organic group)

[5] The resin composition according to [3] or [4], wherein a content of the epoxy resin having a weight-average molecular weight of 10,000 or more, the epoxy resin including a biphenyl structure, is 1% by weight or more and 50% by weight or less relative to 100% by weight of a solid content in the resin composition excluding the inorganic filler.

[6] The resin composition according to any one of [2] to [5], wherein a content of the epoxy resin including three or more epoxy groups per molecule is 10% by weight or more and 50% by weight or less relative to 100% by weight of a solid content in the resin composition excluding the inorganic filler.

[7] The resin composition according to any one of [2] to [6], wherein the epoxy resin including three or more epoxy groups per molecule has a molecular weight of 800 or less.

[8] The resin composition according to any one of [1] to [7], further comprising a compound having a heterocyclic structure including a nitrogen atom.

[9] The resin composition according to any one of [1] to [8], wherein the aggregated inorganic filler includes boron nitride aggregated particles.

[10] The resin composition according to [9], wherein the boron nitride aggregated particles have a card-house structure.

[11] A composite molded body comprising a cured product part and a metal part, the cured product part including a cured product of the resin composition according to any one of [1] to.

[12] A semiconductor device comprising the composite molded body according to.

[13] A resin cured product comprising a resin composition, the resin composition including a resin and an aggregated inorganic filler,
wherein an increase in a weight of the resin cured product at 85° C. and 85% RH is 0.80% or less, and
wherein a storage modulus of a cured product of the resin composition excluding the inorganic filler at 200° C. is $1.0 \times 10^7$ Pa or more.

The resin composition according to the present invention has a high strength and excellent moisture-absorption reflow resistance and minimizes the risk of the interfacial detachment being caused by the heat expansion and contraction in the case where the resin composition is combined with a metal sheet to form a multilayer body.

The resin cured product according to the present invention has a high strength and excellent moisture-absorption reflow resistance and minimizes the risk of the interfacial detachment being caused by the heat expansion and contraction in the case where the resin cured product is combined with a metal sheet to form a multilayer body.

The above-described resin composition and resin cured product according to the present invention and a composite molded body produced using the resin composition may be suitably used as a heat dissipation sheet for power semiconductor devices and enables the production of highly reliable power semiconductor modules.

DESCRIPTION OF EMBODIMENTS

Details of an embodiment of the present invention are described below. The present invention is not limited to the following embodiment and may be modified in various ways within the scope of the present invention.

[Resin Composition]

A resin composition according to the present invention includes a resin and an aggregated inorganic filler. The increase in the weight of a cured product of the resin composition at 85° C. and 85% RH is 0.80% or less. The storage modulus of a cured product of the resin composition excluding the inorganic filler at 200° C. is $1.0 \times 10^7$ Pa or more.

The term "resin composition" used herein refers to a resin composition that has not been cured, such as a resin composition that is to be cured in a molding and pressurization step or the like. Specific examples thereof include a slurry-like resin composition used in the coating step described below, a sheet that has been subjected to the coating step, and a sheet that has been subjected to the steps of coating, drying, etc. and has not been cured.

The term "resin cured product" used herein refers to a cured resin such that the exothermic peak determined by differential scanning calorimetry (DSC) when the cured resin is heated from 40° C. to 250° C. at 10° C./min is 10 J/g or less.

The term "resin composition excluding the inorganic filler" used herein refers to the components of the resin composition which are other than the inorganic filler. The inorganic filler, which is described below, includes an aggregated inorganic filler and an inorganic filler that has not been aggregated (non-aggregated inorganic filler).

The term "solid component" of the resin composition which is used herein refers to all the components of the resin composition which are other than the solvent.

The resin composition according to the present invention may include an "other component" other than the resin or the aggregated inorganic filler in an amount with which the advantageous effects of the present invention are not impaired. Examples of the other component include a non-aggregated inorganic filler, a curing agent, a curing catalyst, a solvent, a surface-treating agent such as a silane coupling agent, an insulating carbon component such as a reductant, a viscosity modifier, a dispersing agent, a thixotropy-imparting agent, a flame retardant, a colorant, an organic filler, and an organic solvent. In particular, adding a dispersing agent to the resin composition according to the present invention enables the formation of a uniform resin cured product, which may enhance the thermal conductivity and dielectric breakdown property of the resin cured product. Specific examples of the "other component" that may be included in the resin composition according to the present invention are described below.

<Storage Modulus>

The storage modulus of a cured product of the resin composition according to the present invention excluding the inorganic filler at 200° C. is $1.0 \times 10^7$ Pa or more. If the above storage modulus is less than $1 \times 10^7$ Pa, a resin cured product formed by curing the resin composition according to the present invention (hereinafter, referred to simply as "resin cured product") may have a low strength. Consequently, in the moisture-absorption reflow test, insulating property may become degraded as a result of formation of voids inside the resin cured product. Furthermore, in a composite molded body constituted by a cured product part composed of a cured product of the resin composition according to the present invention and a metal part, detachment may occur at the interface between the metal part and the cured product part.

In order to maintain suitable performance after the moisture-absorption reflow test, the above storage modulus is preferably $1.3 \times 10^7$ Pa or more, is more preferably $1.5 \times 10^7$ Pa or more, and is further preferably $1.7 \times 10^7$ Pa or more.

The above storage modulus is preferably $5 \times 10^9$ Pa or less, is more preferably $1 \times 10^9$ Pa or less, and is more preferably $5 \times 10^8$ Pa or less. When the above storage modulus is equal to or less than the above upper limit, the likelihood of the internal stress produced by conducting the moisture-absorption reflow test being increased to an excessive degree may be reduced and cracking of the resin cured product and detachment at the interface between the metal part and the resin cured product part may be limited.

When the above storage modulus falls within the above range, the likelihood of a cured product of the resin composition entering the irregularities formed in the metal, which is the adherend described below, may be increased. The resin cured product charged in the irregularities produces a strong anchoring effect, which increases the adhesion between the metal and the resin cured product.

The storage modulus of the cured product can be adjusted to fall within the specific range by, for example, introducing a rigid structure, such as an aromatic ring, into the constituent of the resin-containing component, or introducing a multifunctional component having plural reactive groups into the constituent of the resin-containing component in order to increase the crosslinking density of the cured product, as described below.

The conditions under which the resin composition according to the present invention excluding the inorganic filler is cured in the measurement of storage modulus are as described in Examples below. That is, the temperature is increased from 25° C. to 120° C. at 14° C./min, holding is performed at 120° C. for 30 minutes, the temperature is subsequently increased to 175° C. at 7° C./min, holding is performed at 175° C. for 30 minutes, the temperature is then increased to 200° C. at 7° C./min, and holding is performed at 200° C. for 10 minutes.

The method for measuring storage modulus may be any method known in the related art. Specific examples thereof include the method described in Examples below.

<Weight Increase>

The increase in the weight of a cured product of the resin composition according to the present invention (including the inorganic filler) at 85° C. and 85% RH is 0.8% or less. If the above weight increase is more than 0.8%, the object of the present invention, that is, the maintenance of high insulating property subsequent to the moisture-absorption reflow test and prevention of the interfacial detachment, may fail to be achieved.

In order to maintain high insulating property subsequent to the moisture-absorption reflow test and prevent the interfacial detachment, the above weight increase is preferably minimized. The weight increase is preferably 0.75% or less and is more preferably 0.7% or less. The lower limit for the weight increase is not specified; for example, the weight increase is 0.2% or more in order to maintain the strength and insulating property of the resin cured product in a balanced manner and enhance film formability.

There are many possible factors contributing to the increase in the weight of the resin cured product. It is important to control a weight increase caused due to moisture absorption.

The present invention was made since it was found that the issues of the present invention may be addressed by adjusting the increase in the weight of a cured product of the resin composition at 85° C. and 85% RH to fall within the above specific range.

A resin composition the increase in the weight of which at 85° C. and 85% RH falls within the specific range can be produced by, for example, introducing a highly hydrophobic structure, such as an aliphatic skeleton or an aromatic ring, to a constituent of the resin component of the resin composition in order to control the weight increase.

The increase in the weight of a cured product of the resin composition according to the present invention at 85° C. and 85% RH is measured by the method described in Examples below.

<Resin>

The resin included in the resin composition according to the present invention is not limited and may be any resin that has a specific storage modulus and a specific weight increase after being cured. Examples of the resin include resins that can be cured by heat or light in the presence of a curing agent or a curing catalyst. In particular, the resin is preferably a thermosetting resin from the viewpoint of ease of production.

Specific examples of the above resin include an epoxy resin, a phenolic resin, a polycarbonate resin, an unsaturated polyester resin, a urethane resin, a melamine resin, a urea resin, and a maleimide resin. Among these, an epoxy resin is preferable from the viewpoints of viscosity, thermal resistance, hygroscopicity, and ease of handling. Examples of the epoxy resin include an epoxy group-containing silicon compound, an aliphatic epoxy resin, a bisphenol A- or F-type epoxy resin, a novolac-type epoxy resin, an alicyclic epoxy resin, a glycidyl ester-type epoxy resin, a multifunctional epoxy resin, and a high-molecular-weight epoxy resin.

The content of the above resin in the resin composition according to the present invention is preferably 5% by weight or more, is more preferably 30% by weight or more, and is further preferably 50% by weight or more relative to 100% by weight of the solid content in the resin composition excluding the inorganic filler. The content of the resin in the resin composition according to the present invention is more preferably 99% by weight or less relative to 100% by weight of the solid content in the resin composition excluding the inorganic filler. When the above resin content is equal to or more than the above lower limit, suitable formability may be achieved. When the above resin content is equal to or less than the above upper limit, the contents of the other components may be maintained at certain levels and a high thermal conductivity is likely to be achieved.

(Epoxy Resin)

Epoxy resin is a general term for a class of compounds that include one or more oxirane rings (epoxy groups) per molecule. The oxirane ring (epoxy group) included in the epoxy resin may be either an alicyclic epoxy group or a glycidyl group.

The epoxy resin used in the present invention may be a compound containing an aromatic oxirane ring (epoxy group). Specific examples thereof include bisphenol-type epoxy resins and biphenyl-type epoxy resins produced by converting a bisphenol, such as bisphenol A, bisphenol F, bisphenol AD, bisphenol S, tetramethyl bisphenol A, tetramethyl bisphenol F, tetramethyl bisphenol AD, tetramethyl bisphenol S, or tetrafluoro bisphenol A, to a glycidyl compound; epoxy resins produced by converting a divalent phenol, such as dihydroxynaphthalene or 9,9-bis(4-hydroxyphenyl) fluorene, to a glycidyl compound; epoxy resins produced by converting a trisphenol, such as 1,1,1-tris(4-hydroxyphenyl) methane, to a glycidyl compound; epoxy resins produced by converting a tetrakisphenol, such as 1,1,2,2-tetrakis(4-hydroxyphenyl) ethane, to a glycidyl compound; and novolac-type epoxy resins produced by converting a novolac, such as phenol novolac, cresol novolac, bisphenol A, novolac, or brominated bisphenol A novolac, to a glycidyl compound.

The content of the epoxy resin in the resin composition according to the present invention is preferably 20% by weight or more and is more preferably 45% by weight or more relative to 100% by weight of the resin included in the resin composition according to the present invention. The upper limit for the content of the epoxy resin in the resin composition according to the present invention is not specified; the content of the epoxy resin may be 100% by weight relative to 100% by weight of the entire resin component. When the content of the epoxy resin falls within the above range, an increase in the elasticity of a cured product of the resin composition and the control of weight increase may be readily achieved, which makes it easy to adjust storage modulus and weight increase to fall within the respective specific ranges described above.

((Multifunctional Epoxy Resin))

The resin composition according to the present invention preferably includes an epoxy resin including three or more oxirane rings (epoxy groups) per molecule (hereinafter, this epoxy resin may be referred to as "multifunctional epoxy resin"). When the resin composition according to the present invention includes the multifunctional epoxy resin, highly polar oxirane rings (epoxy groups) can be introduced to the resin composition at a high density. This increases the effects of physical interactions, such as Van der Waals forces and hydrogen bonding, and thereby increases the adhesion between the metal and resin cured product included in the composite molded body.

Furthermore, when the resin composition includes the multifunctional epoxy resin, it becomes easy to adjust the storage modulus of the resin cured product to fall within the above specific range. This may increase the adhesion between the metal and the resin cured product.

In addition, increasing the reactivity of the oxirane rings (epoxy groups) may reduce the amount of hydroxyl groups that have not reacted in the curing reaction and thereby limit an increase in hygroscopicity.

The above multifunctional epoxy resins may be used alone or in combination of two or more.

The multifunctional epoxy resin is an epoxy resin including three or more oxirane rings (epoxy groups) per molecule and is preferably an epoxy resin including four or more oxirane rings (epoxy groups) per molecule. The upper limit for the number of the oxirane rings (epoxy groups) included in a molecule of the multifunctional epoxy resin is not specified. The number of the above oxirane rings (epoxy groups) per molecule is preferably 10 or less, is more preferably 8 or less, and is particularly preferably 6 or less. When the number of the above oxirane rings (epoxy groups) per molecule falls within the above range, the adhesion between the metal and the resin cured product may be increased and an increase in hygroscopicity may be limited.

The oxirane rings (epoxy groups) are more preferably glycidyl groups from the viewpoints of reaction velocity and thermal resistance.

When the resin composition according to the present invention includes the multifunctional epoxy resin including plural oxirane rings (epoxy groups) or, in particular, plural glycidyl groups per molecule, the crosslinking density of the cured product is increased and, consequently, the resin cured product may have a further high strength. This enables the resin cured product to maintain its shape without becoming deformed or fractured when internal stress occurs inside the resin cured product in the moisture-absorption reflow test and consequently may reduce the formation of gaps, such as voids, inside the resin cured product.

The molecular weight of the multifunctional epoxy resin is not limited. The molecular weight of the multifunctional epoxy resin is preferably 1,000 or less, is more preferably 800 or less, and is further preferably 600 or less. The molecular weight of the multifunctional epoxy resin is preferably 100 or more and is more preferably 150 or more. When the molecular weight of the multifunctional epoxy resin falls within the above range, it may become easy to adjust the storage modulus of the resin cured product, which is produced by curing the resin composition, at 200° C. to be $1.0 \times 10^7$ Pa or more.

Specific examples of the multifunctional epoxy resin include EX321L, DLC301, and DLC402 produced by Nagase ChemteX Corporation.

The content of the multifunctional epoxy resin in the resin composition according to the present invention is not limited. The content of the multifunctional epoxy resin is preferably 5% by weight or more and is more preferably 10% by weight or more relative to 100% by weight of the solid content in the resin composition excluding the inorganic filler. The content of the multifunctional epoxy resin is preferably 50% by weight or less, is more preferably 40% by weight or less, and is further preferably 30% by weight or less. Specifically, the content of the multifunctional epoxy resin is preferably 5% by weight or more and 50% by weight or less, is further preferably 10% by weight or more and 40% by weight or less, and is particularly preferably 10% by weight or more and 30% by weight or less. When the content of the multifunctional epoxy resin is equal to or more than the above lower limit, the above-described advantageous effects of the addition of the multifunctional epoxy resin may be achieved in an effective manner. When the content of the multifunctional epoxy resin is equal to or less than the above upper limit, the hygroscopicity of the resin cured product may be limited, and the strength performance of the resin cured product may be enhanced, and the above properties may be maintained in a balanced manner.

((Specific Epoxy Resin))

The resin included in the resin composition according to the present invention preferably includes an epoxy resin that has a weight-average molecular weight of 10,000 or more and includes a biphenyl structure (hereinafter, the above epoxy resin may be referred to as "specific epoxy resin").

The term "organic group" used hereinafter refers to any group including a carbon atom. Examples of the organic group include an alkyl group, an alkenyl group, and an aryl group, which may be optionally substituted with a halogen atom, a group including a hetero atom, or another hydrocarbon group.

The specific epoxy resin, which has a weight-average molecular weight of 10,000 or more and includes a biphenyl structure, preferably further includes at least one structure preferably selected from the structure represented by Structural Formula (1) below (hereinafter, this structure may be referred to as "structure (1)") and the structure represented by Structural Formula (2) below (hereinafter, this structure may be referred to as "structure (2)").

[Chem. 2]

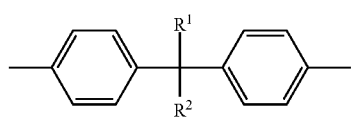
(1)

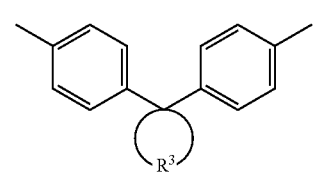
(2)

(in Formula (1), $R^1$ and $R^2$ each represent an organic group; and, in Formula (2), $R^3$ represents a divalent cyclic organic group)

Examples of the specific epoxy resin include an epoxy resin including the structure represented by Structural Formula (3) below (hereinafter, this structure may be referred to as "structure (3)").

[Chem. 3]

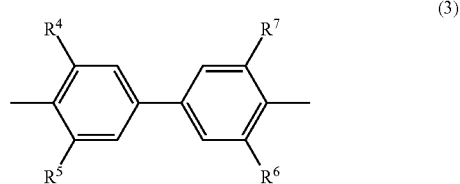
(3)

(in Formula (3), $R^4$, $R^5$, $R^6$, and $R^7$ each independently represent an organic group having a molecular weight of 15 or more)

It is preferable that, in Formula (1) above, at least one of $R^1$ and $R^2$ be an organic group having a molecular weight of 16 or more and particularly preferably having a molecular weight of 16 to 1,000. Examples of such organic groups include alkyl groups, such as an ethyl group, a propyl group, a butyl group, a pentyl group, a hexyl group, and a heptyl group; and aryl groups, such as a phenyl group, a tolyl group, a xylyl group, a naphthyl group, and a fluorenyl group.

Both of $R^1$ and $R^2$ may be an organic group having a molecular weight of 16 or more. In another case, one of $R^1$ and $R^2$ may be an organic group having a molecular weight of 16 or more and the other may be an organic group having a molecular weight of 15 or less or a hydrogen atom. It is preferable that one of $R^1$ and $R^2$ be an organic group having a molecular weight of 16 or more and the other be an organic group having a molecular weight of 15 or less. It is particularly preferable that one of $R^1$ and $R^2$ be a methyl group and the other be a phenyl group in order to readily control ease of handling, such as resin viscosity, and from the viewpoint of the strength of the cured product.

In Formula (2), $R^3$ is a divalent cyclic organic group, which may be either an aromatic ring structure, such as a benzene ring structure, a naphthalene ring structure, or a fluorene ring structure, or an aliphatic ring structure, such as cyclobutane, cyclopentane, or cyclohexane. The above structures may independently include a substituent, such as a hydrocarbon group or a halogen atom.

The divalent linkage included in $R^3$ may be either a divalent group attached to a single carbon atom or a divalent group attached to different carbon atoms. Preferable examples thereof include a divalent aromatic group having 6 to 100 carbon atoms and a divalent group derived from a cycloalkane having 2 to 100 carbon atoms, such as cyclopropane or cyclohexane. $R^3$ is particularly preferably a 3,3,5-trimethyl-1,1-cyclohexylene group represented by Structural Formula (4) below from the viewpoints of the control of ease of handling, such as resin viscosity, and the strength of the cured product.

[Chem. 4]

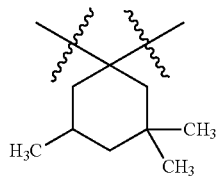

(4)

In Formula (3), $R^4$, $R^5$, $R^6$, and $R^7$ each independently represent an organic group having a molecular weight of 15 or more. This organic group is preferably an alkyl group having a molecular weight of 15 to 1,000. It is particularly preferable that all of $R^4$, $R^5$, $R^6$, and $R^7$ be methyl groups from the viewpoints of the control of ease of handling, such as resin viscosity, and the strength of the cured product.

The specific epoxy resin is preferably an epoxy resin including any one of the structures (1) and (2) and the biphenyl structure and is particularly preferably an epoxy resin including any one of the structures (1) and (2) and the structure (3). When the specific epoxy resin includes the above structures, the hygroscopicity of the cured product may be limited, and the strength of the resin composition may be maintained, and the above properties may be maintained in a balanced manner.

The above-described specific epoxy resin includes a hydrophobic hydrocarbon and aromatic structure in a larger amount than common epoxy resins having a bisphenol-A or bisphenol-F skeleton. Therefore, the addition of the specific epoxy resin reduces the amount of moisture absorbed by a cured product of the resin composition.

In order to reduce moisture absorption, it is preferable that the specific epoxy resin include the structures (1), (2), and (3), which are hydrophobic structures, in large amounts.

The weight-average molecular weight of the specific epoxy resin is preferably 10,000 or more, is more preferably 20,000 or more, and is further preferably 25,000 or more; and is preferably 80,000 or less, is more preferably 70,000 or less, and is further preferably 60,000 or less.

It is preferable that the degree of hydrophobicity of the specific epoxy resin be maximized. Specifically, it is preferable that the epoxy equivalent weight of the specific epoxy resin be maximized. The epoxy equivalent weight of the specific epoxy resin is preferably 3,000 g/eq or more, is more preferably 4,000 g/eq or more, and is further preferably 5,000 g/eq or more. The epoxy equivalent weight of the specific epoxy resin is preferably 20,000 g/eq or less and is more preferably 5,000 g/eq or more and 20,000 g/eq or less.

The weight-average molecular weight of the epoxy resin is a polystyrene-equivalent molecular weight determined by gel permeation chromatography.

Epoxy equivalent weight is defined as "the weight of epoxy resin containing 1 equivalent weight of epoxy group" and measured in accordance with JIS K7236.

The above-described specific epoxy resins may be used alone or in combination of two or more. The specific epoxy resin may include plural epoxy groups.

The content of the specific epoxy resin in the resin composition according to the present invention is not limited. The content of the specific epoxy resin is preferably 5% by weight or more and is more preferably 10% by weight or more; and is preferably 50% by weight or less and is more preferably 40% by weight or less, relative to 100% by weight of the solid content in the resin composition excluding the inorganic filler. When the content of the specific epoxy resin is equal to or less than the above upper limit, the storage modulus of the cured product is increased or maintained and reflow resistance may be enhanced consequently. When the content of the specific epoxy resin is equal to or more than the above lower limit, the application of the resin composition may be readily done and the resin cured product may have suitable flexibility.

((Ratio Between Contents of Specific Epoxy Resin and Multifunctional Epoxy Resin))

It is particularly preferable that the resin composition according to the present invention include both specific epoxy resin and multifunctional epoxy resin as epoxy resins in order to increase the elasticity of a cured product of the resin composition and reduce the hygroscopicity of the cured product.

In the case where the resin composition according to the present invention includes both specific epoxy resin and multifunctional epoxy resin, the ratio between the contents of the specific epoxy resin and the multifunctional epoxy resin (specific epoxy resin:multifunctional epoxy resin) is preferably, but not limited to, 10 to 90:90 to 10 (by weight), is more preferably 20 to 80:80 to 20 (by weight), and is particularly preferably 30 to 70:70 to 30 (by weight). When the ratio between the contents of the specific epoxy resin and the multifunctional epoxy resin falls within the above range, it becomes easy to adjust the above-described storage modulus and weight increase to fall within the respective adequate ranges.

((Other Epoxy Resin))

The resin composition according to the present invention may optionally include an epoxy resin other than the specific epoxy resin or the multifunctional epoxy resin. Preferable examples of the other epoxy resin included in the resin composition according to the present invention, which is other than the specific epoxy resin or the multifunctional epoxy resin, include, but are not limited to, one or more selected from various bisphenol-type epoxy resins produced by converting a bisphenol to a glycidyl compound, such as a bisphenol A-type epoxy resin and a bisphenol F-type epoxy resin; various biphenyl-type epoxy resins produced by converting a biphenyl to a glycidyl compound; epoxy resins produced by converting an aromatic compound including two hydroxyl groups, such as dihydroxynaphthalene or 9,9-bis(4-hydroxyphenyl) fluorene, to a glycidyl compound; epoxy resins produced by converting a trisphenol, such as 1,1,1-tris(4-hydroxyphenyl) methane, to a glycidyl compound; epoxy resins produced by converting a tetrakisphenol, such as 1,1,2,2-tetrakis(4-hydroxyphenyl) ethane, to a glycidyl compound; novolac-type epoxy resins produced by converting a novolac, such as phenol novolac, cresol novolac, bisphenol A novolac, or brominated bisphenol A novolac, to a glycidyl compound; and silicone-containing epoxy resins.

<Inorganic Filler>

In the present invention, an inorganic filler includes an aggregated inorganic filler and a non-aggregated inorganic filler.

The resin composition according to the present invention includes an aggregated inorganic filler.

The resin composition according to the present invention may include a non-aggregated inorganic filler in addition to the aggregated inorganic filler. Examples of the non-aggregated inorganic filler include the spherical filler described below.

When the resin composition according to the present invention includes the aggregated inorganic filler, the thermal conductivity and insulating property of the resin cured product can be enhanced. Furthermore, the coefficient of linear expansion of the resin cured product can be controlled. In particular, particles of the aggregated inorganic filler are brought into contact with one another and consequently become deformed in the pressurization step described below. Thus, the particles of the aggregated inorganic filler are in surface contact with one another. This increases the number of the thermal conduction pathways formed and enables the production of a resin cured product having a high thermal conductivity. Furthermore, the deformation of the aggregated inorganic filler enables the gaps and voids present between the filler particles to be removed in an effective manner. This enhances insulating property.

The resin composition according to the present invention includes the resin and the inorganic filler. In particular, using the above-described epoxy resin suitable in the present invention in combination with an aggregated inorganic filler enables particles of the aggregated inorganic filler to be kept deformed even after the filler particles have become deformed in the pressurization step described below. Moreover, when the increase in the weight of a cured product of the resin composition according to the present invention falls within the specific range described above, particles of the aggregated inorganic filler can be kept deformed even after the moisture-absorption reflow step.

In the case where the resin composition and the resin cured product include only a single filler, such as silica or alumina, particles of the filler are in point contact with one another even after the pressurization step and it is not possible to form thermal conduction pathways in an effective manner. In addition, the gaps and voids present between the filler particles may fail to be removed, which degrades insulating property.

The form of aggregation of the aggregated inorganic filler can be determined with a scanning electron microscope (SEM).

(Aggregated Inorganic Filler)

The aggregated inorganic filler may be an electrically insulative inorganic filler. Examples thereof include an inorganic filler composed of at least one type of inorganic particles selected from the group consisting of particles of a metal carbide, a metal oxide, and a metal nitride.

Examples of the metal carbide include silicon carbide, titanium carbide, and tungsten carbide.

Examples of the metal oxide include magnesium oxide, aluminum oxide, silicon oxide, calcium oxide, zinc oxide, yttrium oxide, zirconium oxide, cerium oxide, ytterbium oxide, and SIALON (a ceramic composed of silicon, aluminum, oxygen, and nitrogen).

Examples of the metal nitride include boron nitride, aluminum nitride, and silicon nitride.

In particular, in the case where the resin composition or the resin cured product is used in an application that requires a certain insulating property, such as power semiconductors, it is preferable that the aggregated inorganic filler be composed of an inorganic compound having a volume resistivity of $1 \times 10^{13}$ Ω·cm or more and particularly having $1 \times 10^{14}$ Ω·cm or more, that is, an excellent insulating property. In particular, it is preferable that the inorganic particles constituting the aggregated inorganic filler be composed of the metal oxide and/or the metal nitride in order to produce a resin cured product having a sufficiently high electrical insulating property.

Specific examples of such metal oxides and metal nitrides include alumina ($Al_2O_3$, volume resistivity: $1 \times 10^{14}$ Ω·cm), aluminum nitride (AlN, volume resistivity: $1 \times 10^{14}$ Ω·cm), boron nitride (BN, volume resistivity: $1 \times 10^{14}$ Ω·cm), silicon nitride ($Si_3N_4$, volume resistivity: $1 \times 10^{14}$ Ω·cm), and silica ($SiO_2$, volume resistivity: $1 \times 10^{14}$ Ω·cm). Among these, alumina, aluminum nitride, boron nitride, and silica are preferable, and alumina and boron nitride are particularly preferable.

The method for performing aggregation to produce the aggregated inorganic filler and the degree to which the aggregation is performed are not limited.

The aggregated inorganic filler may be subjected to a surface treatment using a surface-treating agent. The surface-treating agent may be a common surface-treating agent known in the related art.

Only one type of the above aggregated inorganic fillers may be used alone. Alternatively, two or more types of the above aggregated inorganic fillers may be used in any combination at any mixing ratio.

The aggregated inorganic filler preferably includes the boron nitride aggregated particles described below in order to produce the above-described advantageous effects of using the aggregated inorganic filler in an effective manner. The boron nitride aggregated particles may be used in combination with another type of inorganic filler particles having a different shape.

(Boron Nitride Aggregated Particles)

Boron nitride has a high thermal conductivity. However, since particles of boron nitride are scale-like, the thermal resistance of boron nitride particles in a direction perpendicular to the plane is high, while the thermal conductivity of boron nitride particles in the planar direction is high. Aggregated particles formed by aggregating such scale-like particles in a spherical form are preferable because they are also easy to handle.

In the boron nitride aggregated particles formed by stacking boron nitride particles on top of one another in a cabbage-like form, the thermal resistance of the aggregated particles in the radial direction is high.

It is preferable that the boron nitride aggregated particles be produced by arranging the boron nitride particles in the planar direction such that the thermal conductivity of the aggregated particles in the radial direction is high.

It is also preferable that the boron nitride aggregated particles have a card-house structure.

The "card-house structure" is the structure described in, for example, Ceramic 43 No. 2 (published by The Ceramic Society of Japan, 2008), in which plate-like particles are stacked on top of one another in a non-oriented, complex manner. Specifically, each of the boron nitride aggregated particles having a card-house structure is an assembly of boron nitride primary particles and has a structure in which the planar portions of the primary particles are in contact with the edge portions of the primary particles to form aggregates having a T-shape or the like.

The boron nitride aggregated particles used in the present invention are particularly preferably boron nitride aggregated particles having the card-house structure. The use of the boron nitride aggregated particles having a card-house structure further increases thermal conductivity.

The new Mohs hardness of the boron nitride aggregated particles is not limited but is preferably 5 or less. The lower limit for the new Mohs hardness of the boron nitride aggregated particles is not limited and is, for example, 1 or more.

When the new Mohs hardness is 5 or less, the likelihood of the particles dispersed in the resin composition coming into plane contact with one another is high, thermal conduction pathways are formed between the particles, and the thermal conductivity of the resin cured product may be enhanced accordingly.

The volume-average particle size of the boron nitride aggregated particles is preferably, but not limited to, 10 μm or more and is more preferably 15 μm or more. The volume-average particle size of the boron nitride aggregated particles is preferably 100 μm or less and is more preferably 90 μm or less. When the volume-average particle size is equal to or more than the above lower limit, the interface between the particles is limited in the resin composition and the resin cured product. This may reduce thermal resistance and increase thermal conductivity. When the above volume-average particle size is equal to or less than the above upper limit, the resin cured product may have suitable surface smoothness.

The volume-average particle size of the boron nitride aggregated particles is the particle size at which the cumulative volume reaches 50% in a cumulative curve drawn with the volume of the powder subjected to the measurement being 100%.

Examples of the method for measuring volume-average particle size include a wet measurement method in which a sample prepared by dispersing the aggregated particles in a pure-water medium containing sodium hexametaphosphate, which serves as a dispersion stabilizer, is measured with a laser diffraction/scattering particle size distribution analyzer or the like; and a dry measurement method in which "Morphologi" produced by Malvern is used.

The same applies to the volume-average particle size of the spherical inorganic filler described below.

(Content of Aggregated Inorganic Filler)

The content of the aggregated inorganic filler in the resin composition according to the present invention is preferably 30% by weight or more, is more preferably 40% by weight or more, and is further preferably 45% by weight or more relative to 100% by weight of the solid content in the resin composition. The content of the aggregated inorganic filler in the resin composition according to the present invention is preferably 99% by weight or less, is more preferably 90% by weight or less, and is further preferably 80% by weight or less relative to 100% by weight of the solid content in the resin composition. When the content of the aggregated inorganic filler is equal to or more than the above lower limit, the advantageous effects of using the aggregated inorganic filler to increase thermal conductivity and control the coefficient of linear expansion may be achieved to a sufficient degree. When the content of the aggregated inorganic filler is equal to or less than the above upper limit, the formability of the resin composition and resin cured product and the interfacial adhesion of the composite molded body may be enhanced.

(Non-Aggregated Inorganic Filler)

The resin composition according to the present invention may include a non-aggregated inorganic filler as an inorganic filler, in addition to the aggregated inorganic filler.

The non-aggregated inorganic filler is preferably, for example, a spherical inorganic filler having a thermal conductivity of 10 W/m·K or more, preferably 15 W/m·K or more, more preferably 20 W/m·K or more, and, for example, 20 to 30 W/m·K and a new Mohs hardness of 3.1 or more and, for example, 5 to 10. Using such a spherical inorganic filler in combination with the above-described aggregated inorganic filler increases the adhesion of the resin cured product to metals and enhance the heat dissipation capacity of the resin cured product.

The term "spherical" used herein refers to any shape that can be commonly recognized as spherical. For example, a shape having an average circularity of 0.4 or more may be considered spherical. In another case, a shape having an average circularity of 0.6 or more may be considered spherical. Normally, the upper limit for average circularity is 1. The circularity of a particle can be measured by image processing of a projected image of the particle with FPIA Series produced by Sysmex Corporation or the like.

The spherical inorganic filler is preferably at least one selected from the group consisting of alumina, synthetic magnesite, silica, aluminum nitride, silicon nitride, silicon carbide, zinc oxide, and magnesium oxide. The use of the preferable spherical inorganic fillers may further enhance the heat dissipation capacity of the resin cured product.

The volume-average particle size of the spherical inorganic filler is preferably 0.5 μm or more and 40 μm or less. When the above volume-average particle size is 0.5 μm or more, the resin and the inorganic filler can readily flow during heat molding and the interfacial adhesion of the composite molded body according to the present invention may be increased accordingly. When the above average particle size is 40 μm or less, the dielectric breakdown property of the resin cured product may be readily maintained.

In the case where the aggregated inorganic filler and the non-aggregated inorganic filler are used in combination as inorganic fillers, the ratio between the contents of the aggregated inorganic filler and the non-aggregated inorganic filler in the resin composition is preferably, but is not limited to, 90:10 to 10:90 by weight and is more preferably 80:20 to 20:80 by weight.

The total content of the aggregated inorganic filler and the non-aggregated inorganic filler in the resin composition according to the present invention is preferably 30% by weight or more, is more preferably 40% by weight or more, and is further preferably 50% by weight or more relative to 100% by weight of the solid content in the resin composition. The total content of the aggregated inorganic filler and the non-aggregated inorganic filler in the resin composition according to the present invention is preferably 99% by weight or less, is more preferably 90% by weight or less, and is further preferably 80% by weight or less relative to 100% by weight of the solid content in the resin composition.

<Other Component>

The resin composition according to the present invention may include a component other than any of the above-described components in an amount with which the advantageous effects of the present invention are not impaired. Examples of the other component include a compound having a heterocyclic structure including a nitrogen atom, a curing agent, a curing catalyst, a surface-treating agent used for improving the interfacial adhesion between the inorganic filler and the resin, such as a silane coupling agent, an insulating carbon component, such as a reductant, a viscosity modifier, a dispersing agent, a thixotropy-imparting agent, a flame retardant, a colorant, an organic filler, an organic solvent, and a thermoplastic resin.

Whether or not the resin composition according to the present invention includes the other component and the content of the other component in the resin composition are not limited as long as the advantageous effects of the present invention are not significantly impaired.

(Compound Having Heterocyclic Structure Including Nitrogen Atom)

The resin composition according to the present invention may include a compound having a heterocyclic structure including a nitrogen atom.

When the resin composition according to the present invention includes the compound having a heterocyclic structure including a nitrogen atom (hereinafter, may be referred to as "nitrogen-containing heterocyclic compound"), the adhesion between a resin cured product formed using the resin composition according to the present invention and a metal may be increased. Specifically, when the resin composition or the resin cured product is combined with a metal, the nitrogen-containing heterocyclic compound is present at the interface therebetween and thereby increases the adhesion between the resin composition or the resin cured product and the metal. From the above-described viewpoint, in order to increase the likelihood of the nitrogen-containing heterocyclic compound being retained at the interface between the resin composition or the resin cured product and the metal, it is more preferable that the nitrogen-containing heterocyclic compound have a low molecular weight.

The molecular weight of the nitrogen-containing heterocyclic compound is preferably 1,000 or less and is more preferably 500 or less. The lower limit for the molecular weight of the nitrogen-containing heterocyclic compound is preferably, but not limited to, 60 or more and is more preferably 70 or more.

Examples of the heterocyclic structure included in the nitrogen-containing heterocyclic compound include structures derived from imidazole, triazine, triazole, pyrimidine, pyrazine, pyridine, and azole.

The nitrogen-containing heterocyclic compound may include plural heterocyclic structures in a single molecule.

In order to enhance the insulating property of the resin composition and adhesion to metals, the nitrogen-containing heterocyclic compound is preferably an imidazole compound or a triazine compound.

Examples of the imidazole compound and the triazine compound that are preferable as the nitrogen-containing heterocyclic compound include 2-ethyl-4-methylimidazole, 2-phenylimidazole, 1-benzyl-2-methylimidazole, 1-benzyl-2-phenylimidazole, 1-cyanoethyl-2-undecylimidazole, 1-cyanoethyl-2-ethyl-4-methylimidazole, 2-phenyl-4-methylimidazole, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4' methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, 2,4-diamino-6-vinyl-s-triazine, 2,4-diamino-6-vinyl-s-triazine isocyanuric acid adduct, 2,4-diamino-6-methacryloyloxyethyl-s-triazine, and 2,4-diamino-6-methacryloyloxyethyl-s-triazine isocyanuric acid adduct.

Among these, in particular, structures derived from imidazole and structures derived from triazine are preferable. Structures derived from triazine are particularly preferable. The heterocyclic structure included in the nitrogen-containing heterocyclic compound is particularly preferably a structure derived from 1,3,5-triazine. A structure including plural structural parts selected from the structures described above as examples may also be used. When the nitrogen-containing heterocyclic compound has the above-described structure, the compatibility of the nitrogen-containing heterocyclic compound for resins is high and the reaction activation temperature may be increased. This makes it easy to adjust the cure rate and the physical properties of the cured product and thereby enables improvement of the preservation stability of the resin composition and a further increase in bonding strength after heat molding.

The nitrogen-containing heterocyclic compound may include the curing catalyst described below depending on the structure. Thus, the resin composition according to the present invention may include the nitrogen-containing heterocyclic compound as a curing catalyst.

The above nitrogen-containing heterocyclic compounds may be used alone or in combination of two or more.

The content of the nitrogen-containing heterocyclic compound is preferably 0.001% by weight or more, is more preferably 0.1% by weight or more, and is further preferably 0.5% by weight or more relative to 100% by weight of the solid content in the resin composition excluding the inorganic filler. The content of the nitrogen-containing heterocyclic compound is preferably 10% by weight or less, is more preferably 7% by weight or less, and is further preferably 5% by weight or less relative to 100% by weight of the solid content in the resin composition excluding the inorganic filler. When the content of the nitrogen-containing heterocyclic compound falls within the above range, it may become easy to adjust the storage modulus and the weight increase to fall within the respective specific ranges described above.

In the case where the curing catalyst described below is included in the nitrogen-containing heterocyclic compound judging from the molecular structure, it is preferable that total content of the nitrogen-containing heterocyclic compound which includes the content of the curing catalyst fall within the above range. When the content of the nitrogen-containing heterocyclic compound is equal to or more than the above lower limit, the advantageous effect of the addition of the above compound may be produced to a sufficient degree. When the content of the nitrogen-containing heterocyclic compound is equal to or less than the above upper limit, the reaction may occur in an effective manner, the crosslinking density may be increased, and strength may be increased. Furthermore, preservation stability may be enhanced.

(Curing Agent)

The resin composition according to the present invention may include a curing agent.

The curing agent is preferably, but not limited to, a phenolic resin, an acid anhydride including an aromatic or alicyclic skeleton, or a compound produced by hydrogenation or modification of the acid anhydride. The use of the above preferable curing agents enables the production of a resin cured product having high thermal resistance, high moisture resistance, and high electrical properties in a balanced manner.

The above curing agents may be used alone or in combination of two or more.

The phenolic resin is not limited. Specific examples of the phenolic resin include phenol novolac, o-cresol novolac, p-cresol novolac, t-butylphenol novolac, dicyclopentadiene cresol, poly-p-vinylphenol, bisphenol A-type novolac, xylylene modified novolac, decalin modified novolac, poly(di-o-hydroxyphenyl) methane, poly(di-m-hydroxyphenyl) methane, and poly(di-p-hydroxyphenyl) methane.

In order to further enhance the flexibility and flame retardancy of the resin composition and the mechanical properties and thermal resistance of the resin cured product, a novolac-type phenolic resin having a rigid backbone skeleton and a phenolic resin having a triazine skeleton are preferable.

In order to enhance the flexibility of the resin composition that has not been cured and the toughness of the resin cured product, a phenolic resin including an allyl group is preferable.

Examples of commercial phenolic resins include MEH-8005, MEH-8000H, and NEH-8015 (the above items are all produced by Meiwa Plastic Industries, Ltd.); YLH903 (produced by Mitsubishi Chemical Corporation); LA-7052, LA-7054, LA-7751, LA-1356, and LA-3018-50P (the above items are all produced by Dainippon Ink and Chemicals); and PSM6200, PS6313, and PS6492 (produced by Gun Ei Chemical Industry Co., Ltd.).

The acid anhydride including an aromatic skeleton and the compound produced by hydrogenation or modification of the acid anhydride are not limited. Specific examples thereof include SMA RESIN EF30 and SMA RESIN EF60 (the above items are all produced by Sartomer Japan Inc.); ODPA-M and PEPA (the above items are all produced by Manac Incorporated); RIKACID MTA-10, RIKACID TMTA, RIKACID TMEG-200, RIKACID TMEG-500, RIKACID TMEG-S, RIKACID TH, RIKACID MH-700, RIKACID MT-500, RIKACID DSDA, and RIKACID TDA-100 (the above items are all produced by New Japan Chemical Co., Ltd.); and EPICLON B4400 and EPICLON B570 (the above items are all produced by Dainippon Ink and Chemicals).

The acid anhydride including an alicyclic skeleton and the compound produced by hydrogenation or modification of the acid anhydride are preferably an acid anhydride including a polyalicyclic skeleton and a compound produced by hydrogenation or modification of the acid anhydride; or an acid anhydride including an alicyclic skeleton produced by an addition reaction between a terpene compound and maleic anhydride and a compound produced by hydrogenation or modification of the acid anhydride. Specific examples thereof include RIKACID HNA and RIKACID HNA-100 (the above items are all produced by New Japan Chemical Co., Ltd.); and EPICURE YH306 and EPICURE YH309 (the above items are all produced by Mitsubishi Chemical Corporation).

Whether or not the resin composition according to the present invention includes the curing agent is not limited. In the case where the resin composition according to the present invention includes the curing agent, the content of the curing agent in the resin composition is not limited.

In the case where the resin composition according to the present invention includes the curing agent, the content of the curing agent in the resin composition is preferably 0.5% to 70% by weight and is particularly preferably 0.5% to 55% by weight relative to 100% by weight of the solid content in the resin composition excluding the inorganic filler. When the content of the curing agent is equal to or more than the above lower limit, sufficiently high curability may be achieved. When the content of the curing agent is equal to or less than the above upper limit, the reaction may occur in an effective manner. This increases the crosslinking density and strength. In addition, film formability may be enhanced.

In the case where the resin composition includes the curing agent, the content of the curing agent is preferably 0% to 55% of the epoxy equivalent weight of the resin composition. When the content of the curing agent falls within the above range, the reaction may occur in an effective manner. This increases the crosslinking density and strength. In addition, film formability may be enhanced.

(Curing Catalyst)

The resin composition according to the present invention may include a curing catalyst. The resin composition preferably includes a curing catalyst in addition to the curing agent in order to adjust cure rate, the physical properties of the cured product, etc.

The curing catalyst is not limited and may be selected appropriately in accordance with the type of the resin used and the type of the curing agent used. Specific examples of the curing catalyst include chain and cyclic tertiary amines, organic phosphorus compounds, quaternary phosphonium salts, and diazabicycloalkenes, such as an organic acid salt. Organometallic compounds, quaternary ammonium salts, metal halides, and the like may also be used.

Examples of the organometallic compounds include zinc octoate, tin octoate, and an aluminum acetylacetone complex.

The above compounds may be used alone or in a mixture of two or more.

In the case where the resin composition according to the present invention includes the curing catalyst, the content of the curing catalyst is preferably 0.1% to 10% by weight and is particularly preferably 0.1% to 5% by weight relative to 100% by weight of the solid content in the resin composition excluding the inorganic filler. When the content of the curing catalyst is equal to or more than the above lower limit, the curing reaction is facilitated to a sufficient degree and the resin composition may be cured in a suitable manner. When the content of the curing catalyst is equal to or less than the above upper limit, the cure rate is not excessively high. Therefore, the resin composition according to the present invention has suitable preservation stability.

(Solvent)

The resin composition according to the present invention may include an organic solvent in order to increase ease of application of the resin composition in the case where, for example, a sheet-like resin cured product is formed by a coating step.

Examples of the organic solvent that may be included in the resin composition according to the present invention include methyl ethyl ketone, cyclohexanone, propylene glycol monomethyl ether acetate, butyl acetate, isobutyl acetate, and propylene glycol monomethyl ether.

The above organic solvents may be used alone or in combination of two or more.

In the case where the resin composition according to the present invention includes the organic solvent, the content of the organic solvent may be determined appropriately in accordance with ease of handling of the resin composition in the preparation of the resin cured product, the shape of the resin composition that is to be cured, the drying conditions employed, etc.

In the case where the resin composition according to the present invention is in the form of a slurry that is to be used in the coating step described below, it is preferable to use the organic solvent such that the concentration of the solid component in the resin composition according to the present invention is 10% to 90% by weight and is particularly preferably 40% to 80% by weight.

In the case where the resin composition according to the present invention is in a sheet-like form after being subjected to the steps of coating, drying, etc., the concentration of the solid component in the resin composition according to the present invention is preferably 95% by weight or more and is particularly preferably 98% by weight or more.

(Dispersing Agent)

The resin composition according to the present invention may include a dispersing agent. When the resin composition according to the present invention includes the dispersing agent, a uniform resin cured product can be formed. This may enhance the thermal conductivity and dielectric breakdown property of the resin cured product.

The dispersing agent preferably includes a functional group including a hydrogen atom having a hydrogen bond property. When the dispersing agent includes the functional group including a hydrogen atom having a hydrogen bond property, the thermal conductivity and dielectric breakdown property of the resin cured product may be further enhanced. Examples of the functional group including a hydrogen atom having a hydrogen bond property include a carboxyl group (pKa=4), a phosphate group (pka=7), and a phenol group (pKa=10).

The pKa of the functional group including a hydrogen atom having a hydrogen bond property is preferably 2 to 10 and is more preferably 3 to 9. When the above pKa is 2 or more, the acidity of the dispersing agent falls within an adequate range and, consequently, the reaction of the epoxy resin included in the resin component may be readily limited. This may enhance the storage stability of a molded product that has not been cured. When the pKa is 10 or less, the dispersing agent works sufficiently and the thermal conductivity and dielectric breakdown property of the resin cured product may be enhanced to a sufficient degree.

The functional group including a hydrogen atom having a hydrogen bond property is preferably a carboxyl group or a phosphate group. In such a case, the thermal conductivity and dielectric breakdown property of the resin cured product may be further enhanced.

Specific examples of the dispersing agent include a polyester-type carboxylic acid, a polyether-type carboxylic acid, a polyacryl-type carboxylic acid, an aliphatic carboxylic acid, a polysiloxane-type carboxylic acid, a polyester-type phosphoric acid, a polyether-type phosphoric acid, a polyacryl-type phosphoric acid, aliphatic phosphoric acid, a polysiloxane-type phosphoric acid, a polyester-type phenol, a polyether-type phenol, a polyacryl-type phenol, and a polysiloxane-type phenol.

The above dispersing agents may be used alone or in combination of two or more.

(Organic Filler and Thermoplastic Resin)

The resin composition according to the present invention may include an organic filler and/or a thermoplastic resin. When the resin composition according to the present invention includes the organic filler and the thermoplastic resin, an adequate degree of extensibility is imparted to the resin composition. This reduces the stress and may reduce the occurrence of cracking in a temperature cycle test.

The thermoplastic resin may be any thermoplastic resin known in the related art. Examples of the thermoplastic resin include vinyl-type polymers, such as polyethylene, polypropylene, polystyrene, polyvinyl chloride, a (meth)acrylic resin, an ethylene-vinyl acetate copolymer, and an ethylene-vinyl alcohol copolymer; polyesters, such as a polylactic resin, polyethylene terephthalate, and polybutylene terephthalate; polyamides, such as nylon and polyamide amine; polyvinyl acetal resins, such as polyvinyl acetoacetal, polyvinyl benzal, and a polyvinyl butyral resin; and an ionomer resin, polyphenylene ether, polyphenylene sulfide, polycarbonate, polyether ether ketone, polyacetal, an ABS resin, LCP (liquid crystal polymer), a fluororesin, a urethane resin, a silicone resin, various elastomers, and modified products of the above resins.

The thermoplastic resin may be uniformly dispersed in the resin phase of the resin cured product. In another case, the phase of the thermoplastic resin may be separated from the other phases, such that the shape of the phase can be identified. In the case where the phase separation occurs, the shape of particles of the thermoplastic resin included in the resin cured product may be particulate or fibrous. In the case where the shape of particles of the thermoplastic resin included in the resin cured product is identified, the thermoplastic resin may be identified as an organic filler. The term "organic filler" used herein refers to a natural product, such as wood flour, cellulose or starch that may be modified, various type of organic pigments, and the like and the thermoplastic resin is not classified as an organic filler.

When the thermoplastic resin and the organic filler are insoluble in the above-described resin, an increase in the viscosity of the resin composition can be avoided. For example, in the case where the resin composition is formed into a sheet-like shape as described below, the surface smoothness of the sheet may be enhanced. In such a case, mixing the thermoplastic resin and organic filler insoluble in the above-described resin with a large amount of the inorganic filler simultaneously enables a thermoplastic component phase having high extensibility to be dispersed in the resin cured product in an efficient manner and the stress may be readily reduced consequently. This reduces the occurrence of cracking in the resin cured product without reducing the elasticity of the resin cured product.

From the above viewpoints, the thermoplastic resin is preferably a polyamide resin, such as nylon, or a cellulose resin. A polyamide resin, such as nylon, is particularly preferable.

In the case where the shape of particles of the thermoplastic resin which can be observed in the resin cured product is particulate, the upper limit for the average particle size of the particulate thermoplastic resin is preferably 100 µm or less, is more preferably 50 µm or less, and is further preferably 30 µm or less. Adjusting the average particle size of the particulate thermoplastic resin included in the resin cured product to be equal to or less than the above upper limit enables a sheet-like cured product having an intended thickness to be formed without degrading thermal conductivity.

The average particle size of the particulate thermoplastic resin is determined by observing a cross section of the resin cured product and calculating the average of the maximum diameters of randomly selected 20 particles.

<Resin Cured Product>

A resin cured product according to the present invention is a resin cured product formed using a resin composition including an inorganic aggregated filler. The increase in the weight of the resin cured product at 85° C. and 85% RH is 0.80% or less. The storage modulus of a cured product of the resin composition excluding the inorganic filler at 200° C. is $1.0 \times 10^7$ Pa or more.

The term "resin composition" used herein refers to a resin composition that includes an aggregated inorganic filler and a resin and that has not been cured. The resin composition is preferably, but not limited to, a mixture of an aggregated inorganic filler, a thermosetting resin component such as an epoxy resin, a curing agent used for curing the thermosetting resin, a curing catalyst used as a curing aid, and the like. It is more preferable that the resin composition include a compound having a heterocyclic structure including a nitrogen atom. Examples of the resin composition include the above-described resin composition.

The term "resin composition excluding an inorganic filler" used herein refers to the components of the resin composition which are other than an inorganic filler. The meanings of the terms "resin", "curing agent", "curing catalyst", "compound having a heterocyclic structure including a nitrogen atom", "inorganic filler", "inorganic aggregated filler", and "the other component" used herein are the same as in the description of the resin composition above. Preferable ranges and the like are also the same as in the description of the resin composition above.

The term "resin cured product" used herein refers to a material produced by curing a resin composition. The exothermic peak measured when the resin cured product according to the present invention is heated from 40° C. to 250° C. at 10° C./min by DSC is 10 J/g or less.

The method for producing the resin cured product according to the present invention is not limited. Examples of the production method include a method in which the above-described resin composition is cured.

[Storage Modulus]

The storage modulus of a cured product of the resin composition excluding an inorganic filler at 200° C. is $1.0\times10^7$ Pa or more. In order to maintain suitable performance subsequent to the moisture-absorption reflow test, the above storage modulus is preferably $1.3\times10^7$ Pa or more, is more preferably $1.5\times10^7$ Pa or more, and is further preferably $1.7\times10^7$ Pa or more. The above storage modulus is preferably $5\times10^9$ Pa or less, is more preferably $1\times10^9$ Pa or less, and is more preferably $5\times10^8$ Pa or less.

When the above storage modulus is equal to or less than the above upper limit, the likelihood of the internal stress produced by conducting the moisture-absorption reflow test being increased to an excessive degree may be reduced and cracking of the resin cured product and detachment at the interface between the metal and the resin cured product may be limited.

When the above storage modulus falls within the above range, the likelihood of the resin cured product entering the irregularities formed in the metal, which is the adherend described below, may be increased. The resin cured product charged in the irregularities produces a strong anchoring effect, which increases the adhesion between the metal and the resin cured product.

The storage modulus of the resin included in the resin cured product can be adjusted to fall within the specific range by introducing a rigid structure, such as an aromatic ring, into the constituent of the resin composition used in the production of the resin cured product, or introducing a multifunctional component having plural reactive groups into the constituent of the resin composition in order to increase the crosslinking density of the cured product, as described below. The adjustment of storage modulus can also be done by producing the resin cured product using the above-described resin composition.

The method for measuring storage modulus may be any method known in the related art. Specific examples thereof include the method described in Examples below.

[Weight Increase]

The increase in the weight of the resin cured product according to the present invention (including the inorganic filler) at 85° C. and 85% RH is 0.8% or less. If the above weight increase is more than 0.8%, the object of the present invention, that is, the maintenance of high insulating property subsequent to the moisture-absorption reflow test and prevention of interfacial detachment, may fail to be achieved.

In order to maintain high insulating property subsequent to the moisture-absorption reflow test and prevent the interfacial detachment, the above weight increase is preferably minimized. The weight increase is preferably 0.75% or less and is more preferably 0.7% or less.

The lower limit for the weight increase is not specified; for example, the weight increase is 0.2% or more in order to maintain the strength and insulating property of the resin cured product in a balanced manner and enhance film formability.

There are many possible factors contributing to the increase in the weight of the resin cured product. It is important to control a weight increase caused due to moisture absorption. The present invention was made since it was found that the issues of the present invention may be addressed by adjusting the above weight increase to fall within the above specific range.

A resin cured product the increase in the weight of which at 85° C. and 85% RH falls within the specific range can be produced by, for example, introducing a highly hydrophobic structure, such as an aliphatic skeleton or an aromatic ring, to a constituent of the resin cured product in order to control the weight increase. The production of such a resin cured product may also be achieved by using the above-described resin composition in the production of the resin cured product.

The increase in the weight of the resin cured product according to the present invention at 85° C. and 85% RH is measured by the method described in Examples below.

[Production of Resin Composition and Resin Cured Product]

The method for producing the resin composition according to the present invention and the resin cured product according to the present invention is described below by taking a method for producing a sheet-like resin cured product composed of the resin composition according to the present invention as an example.

The sheet-like resin cured product may be produced by any production method commonly used in the related art. For example, the sheet-like resin cured product may be produced by preparing the resin composition according to the present invention, molding the resin composition into a sheet-like shape, and curing the sheet-like resin composition.

The resin composition according to the present invention may be produced by mixing the inorganic aggregated filler, the resin, and the other optional components with one another by stirring or kneading to form a uniform mixture. For mixing the above components, common kneading apparatus, such as a mixer, a kneader, or a single-screw or twin-screw kneading machine, may be used. Heating may be performed as needed when the above components are mixed.

The order in which the above components are mixed is not limited as long as no significant problem, such as occurrence of reaction or precipitation, arises. For example, the following method may be used.

The resin is mixed with and dissolved in an organic solvent (e.g., methyl ethyl ketone) to prepare a resin solution. To the resin solution, a mixture prepared by mixing the inorganic aggregated filler with the other components to a sufficient degree is added. The resulting mixture is stirred. Subsequently, an organic solvent used for adjustment of viscosity is further added to and mixed with the mixture. Then, additives such as a curing agent, a curing accelerator, and a dispersing agent are further added to and mixed with the mixture.

For molding the resin composition into a sheet-like shape, any method commonly used in the related art may be used.

For example, in the case where the resin composition has plasticity and flowability, molding may be performed by curing the resin composition while the resin composition is charged in a mold or the like in an intended shape. In such a case, injection molding, injection compression molding, extrusion molding, compression molding, and vacuum compression molding may be used.

The solvent included in the resin composition can be removed using any heating method known in the related art, such as a hot plate, a hot-air furnace, an IR heating furnace, a vacuum dryer, or a high-frequency heater.

The sheet-like resin cured product may also be produced by cutting a cured product of the resin composition to an intended shape.

The sheet-like resin cured product may also be produced by forming a slurry-like resin composition into a sheet-like shape using a method such as doctor blading, solvent casting, or extrusion deposition.

An example of the method for producing the sheet-like cured product with a slurry-like resin composition is described below.

<Coating Step>

First, the slurry-like resin composition is applied onto the surface of a base material to form a coating film (sheet-like resin composition).

The coating film is formed on the base material using the slurry-like resin composition by a suitable method, such as dip coating, spin coating, spray coating, or blade coating. For the application of the slurry-like resin composition, coating devices, such as a spin coater, a slit coater, a die coater, or a blade coater, may be used. The use of the above coating devices enables a coating film having a predetermined thickness to be formed on the base material uniformly.

Although the copper plate, copper foil, and PET film described below are commonly used as a base material, the base material is not limited thereto.

<Drying Step>

The coating film formed by the application of the slurry-like resin composition is dried normally at 10° C. to 150° C., preferably at 25° C. to 120° C., and more preferably at 30° C. to 110° C. in order to remove the solvent and low-molecular-weight components.

Setting the drying temperature to be equal to or less than the above upper limit limits the curing of the resin included in the slurry-like resin composition and, in the subsequent pressurization step, allows the resin included in the sheet-like resin composition to flow. This makes it easy to remove the voids. Setting the drying temperature to be equal to or more than the above lower limit enables the solvent to be removed in an effective manner and consequently increases productivity.

The amount of time during which the drying is performed is not limited and may be adjusted appropriately in accordance with the condition of the slurry-like resin composition, the environment in which the drying is performed, and the like. The drying time is preferably 1 minute or more, is more preferably 2 minutes or more, is further preferably 5 minutes or more, is still further preferably 10 minutes or more, is particularly preferably 20 minutes or more, and is most preferably 30 minutes or more. The drying time is preferably 24 hours or less, is more preferably 10 hours or less, is further preferably 4 hours or less, and is particularly preferably 2 hours or less.

Setting the drying time to be equal to or more than the above lower limit enables the solvent to be removed to a sufficient degree and may reduce the likelihood of the retained solvent acting as voids inside the resin cured product. Setting the drying time to be equal to or less than the above upper limit may enhance productivity and reduce the manufacturing costs.

<Pressurization Step>

The sheet-like resin composition is desirably subjected to a pressurization step subsequent to the drying step in order to, for example, cause particles of the aggregated inorganic filler to join to one another and form thermal conduction pathways, eliminate the voids and gaps present inside the sheet, and increase adhesion to the base material.

The pressurization step is preferably conducted by applying a load of 2 MPa or more to the sheet-like resin composition formed on the base material. The load is preferably 5 MPa or more, is more preferably 7 MPa or more, and is further preferably 9 MPa or more. The load is preferably 1500 MPa or less, is more preferably 1,000 MPa or less, and is further preferably 800 MPa or less.

Setting the load applied in the pressurization step to be equal to or less than the above upper limit enables a sheet having a high thermal conductivity without gaps and the like formed inside the sheet-like resin cured product to be produced without fracture of the secondary particles of the aggregated inorganic filler. Setting the above load to be equal to or more than the above lower limit improves the contact between particles of the aggregated inorganic filler and makes it easy to form thermal conduction pathways. This enables the production of the resin cured product having a high thermal conductivity.

The temperature at which the sheet-like resin composition disposed on the substrate is heated in the pressurization step is not limited. The heating temperature is preferably 10° C. or more, is more preferably 20° C. or more, and is further preferably 30° C. or more. The heating temperature is preferably 300° C. or less, is more preferably 250° C. or less, is further preferably 200° C. or less, is still further preferably 100° C. or less, and is particularly preferably 90° C. or less.

Conducting the pressurization step within the above temperature range reduces the melt viscosity of the resin included in the sheet-like resin composition and consequently further reduces the amount of the voids and gaps present inside the resin cured product. Performing heating at a temperature equal to or less than the above upper limit may reduce the decomposition of the organic component of the sheet-like resin composition and resin cured product and the formation of voids caused by the retained solvent.

The amount of time during which the pressurization step is conducted is not limited. The amount of time during which the pressurization step is conducted is preferably 30 seconds or more, is more preferably 1 minute or more, is further preferably 3 minutes or more, and is particularly preferably 5 minutes or more. The amount of time during which the pressurization step is conducted is preferably 1 hour or less, is more preferably 30 minutes or less, and is further preferably 20 minutes or less.

Setting the above pressurization time to be equal to or less than the above upper limit reduces the amount of time required for producing the resin cured product and may reduce the manufacturing costs. Setting the above pressurization time to be equal to or more than the above lower limit enables the gaps and voids present inside the resin cured product to be removed to a sufficient degree and thereby may enhance heat transfer performance and voltage resistance.

<Curing Step>

The curing step, in which a curing reaction of the resin composition according to the present invention is conducted completely, may be conducted under increased pressure or non-increased pressure. The pressurization step and the curing step may be conducted simultaneously.

The load applied when the pressurization step and the curing step are conducted simultaneously is not limited. In such a case, it is preferable to conduct the pressurization step and the curing step while applying a load of 5 MPa or more to the sheet-like resin composition disposed on the base material. The load is more preferably 7 Pa or more, is further preferably 9 MPa or more, and is particularly preferably 20 MPa or more. The load is preferably 2000 MPa or less and is more preferably 1500 MPa or less.

Setting the load applied when the pressurization step and the curing step are conducted simultaneously to be equal to or less than the above upper limit enables a sheet-like cured product having a high thermal conductivity without gaps and the like formed inside the sheet-like resin cured product to be produced without fracture of the secondary particles of the aggregated inorganic filler. Setting the above load to be equal to or more than the above lower limit improves the contact between particles of the aggregated inorganic filler and makes it easy to form thermal conduction pathways. This enables the production of the resin cured product having a high thermal conductivity.

The amount of time during which pressurization is performed when the pressurization step and the curing step are conducted simultaneously is not limited. The above pressurization time is preferably 30 seconds or more, is more preferably 1 minute or more, is further preferably 3 minutes or more, and is particularly preferably 5 minutes or more. The pressurization time is preferably 1 hour or less, is more preferably 30 minutes or less, and is further preferably 20 minutes or less.

Setting the above pressurization time to be equal to or less than the above upper limit reduces the amount of time required for producing the sheet-like resin cured product and may reduce the manufacturing costs. Setting the above pressurization time to be equal to or more than the above lower limit enables the gaps and voids present inside the sheet-like resin cured product to be removed to a sufficient degree and thereby may enhance heat transfer performance and voltage resistance.

The temperature at which the sheet-like resin composition disposed on the substrate is heated when the pressurization step and the curing step are conducted simultaneously is not limited. The heating temperature is preferably 10° C. or more, is more preferably 20° C. or more, and is further preferably 30° C. or more. The heating temperature is preferably 300° C. or less, is more preferably 250° C. or less, is further preferably 200° C. or less, is still further preferably 100° C. or less, and is particularly preferably 90° C. or less.

Setting the heating temperature to be equal to or more than the above lower limit reduces the melt viscosity of the resin included in the sheet-like resin composition and consequently further reduces the amount of the voids and gaps present inside the resin cured product. Setting the heating temperature to be equal to or less than the above upper limit may reduce the decomposition of the organic component of the sheet-like resin composition and sheet-like resin cured product and the formation of voids due to the retained solvent.

The temperature at which the sheet-like resin composition disposed on the substrate is heated when only the curing step is conducted is not limited. The above heating temperature is preferably 10° C. or more, is more preferably 50° C. or more, and is further preferably 100° C. or more. The heating temperature is preferably 500° C. or less, is more preferably 300° C. or less, is further preferably 200° C. or less, is still further preferably 180° C. or less, and is particularly preferably 175° C. or less.

Setting the heating temperature to fall within the above temperature range enables a curing reaction of the resin to occur in an effective manner. Setting the heating temperature to be equal to or less than the above upper limit prevents the thermal degradation of the resin. Setting the heating temperature to be equal to or more than the above lower limit enables a curing reaction of the resin to occur in a further effective manner.

The thickness of the sheet-like resin cured product prepared in the above-described manner is preferably, but not limited to, 50 μm or more, is more preferably 80 μm or more, and is further preferably 100 μm or more. The thickness of the resin cured product is preferably 400 μm or less and is more preferably 300 μm or less.

Adjusting the thickness of the resin cured product to be equal to or more than the above lower limit may impart voltage resistance and increase dielectric breakdown voltage. Adjusting the thickness of the resin cured product to be equal to or less than the above upper limit enables reductions in the sizes and thicknesses of the devices and may limit the thermal resistance of the resin cured product (heat dissipation sheet).

[Composite Molded Body]

A composite molded body according to the present invention includes a cured product part composed of a cured product of the resin composition according to the present invention and a metal part, which are commonly stacked on top of each other to form a single body.

The metal part may be disposed on only one of the surfaces of the cured product part composed of the resin cured product according to the present invention. Alternatively, the metal part may be disposed on two or more of the surfaces of the cured product part. For example, the metal part may be disposed on only one of the surfaces of the resin cured product or both surfaces of the resin cured product. The metal part may be patterned.

The composite molded body according to the present invention can be produced by using the metal part as a base material and forming the resin cured product according to the present invention on the base material in accordance with the above-described method.

The composite molded body according to the present invention can also be produced by forming a sheet-like resin composition or resin cured product on a base material other than the metal part, removing the sheet-like resin composition or resin cured product from the base material, and subsequently bonding the sheet-like resin composition or resin cured product to a metal member used as a metal part by thermocompression bonding.

In such a case, the sheet-like resin composition or resin cured product according to the present invention is formed as described above, except that the slurry-like resin composition according to the present invention is applied to a base material composed of PET (polyethylene terephthalate) or the like, which may optionally be treated with a release agent. After the sheet-like resin composition or resin cured product has been removed from the base material, while it is placed on another metal sheet or interposed between two metal sheets, pressurization is performed to combine the sheet-like resin composition or resin cured product with the metal sheet to form a single body.

The metal sheet may be a metal sheet having a thickness of about 10 μm to about 10 cm which is made of copper, aluminum, nickel-plated metal, or the like.

The surface of the metal sheet may be physically roughened or chemically treated with a surface-treating agent or the like. It is more preferable that the above treatments be performed from the viewpoint of the adhesion between the resin composition and the metal sheet.

[Semiconductor Device]

The composite molded body according to the present invention may be used as a semiconductor device. In particular, the composite molded body according to the present invention may be suitably used in the production of power semiconductor devices which are operated at high temperatures in order to increase output and density.

EXAMPLES

Further details of the present invention are described below with reference to Examples. The present invention is not limited to Examples below without departing the scope of the invention.

The values of various conditions and evaluation results described in Examples below represent the preferable ranges of the present invention as well as the preferable ranges described in the embodiment of the present invention. The preferable ranges of the present invention may be determined by taking the preferable ranges described in the embodiment and the values described in Examples below or a combination of the values described in Examples into consideration.

[Raw Material]

The raw materials used in Examples and Comparative examples are as described below.

<Resin Component>

Resin component 1: Specific epoxy resin including the structure (2) ($R^3$: structure (4)) and the structure (3) ($R^4$, $R^5$, $R^6$, and $R^7$: methyl group), which was produced in accordance with the method for producing an epoxy resin disclosed in Examples of JP 2006-176658 A Polystyrene-equivalent weight-average molecular weight: 30,000

Epoxy equivalent weight: 9,000 g/eq

Resin component 2: Specific epoxy resin including the structure (1) ($R^1$: methyl group, $R^2$: phenyl group) and the structure (3) ($R^4$, $R^5$, $R^6$, and $R^7$: methyl group), which was produced in accordance with the method for producing an epoxy resin disclosed in Examples of JP 2003-342350 A Polystyrene-equivalent weight-average molecular weight: 39,000

Epoxy equivalent weight: 13,000 g/eq

Resin component 3: Bisphenol F-type solid epoxy resin including a structure having two epoxy groups per molecule, which is produced by Mitsubishi Chemical Corporation Polystyrene-equivalent weight-average molecular weight: 60,000

Resin component 4: Bisphenol A-type liquid epoxy resin including a structure having two epoxy groups per molecule, which is produced by Mitsubishi Chemical Corporation Molecular weight: about 370

Resin component 5: Multifunctional epoxy resin including a structure having four or more glycidyl groups per molecule, which is produced by Nagase ChemteX Corporation Molecular weight: about 400

Resin component 6: Hydrogenated bisphenol A-type liquid epoxy resin including a structure having two epoxy groups per molecule, which is produced by Mitsubishi Chemical Corporation Molecular weight: about 410

Resin component 7: p-Aminophenol-type liquid multifunctional epoxy resin including a structure having three or more epoxy groups per molecule, which is produced by Mitsubishi Chemical Corporation Molecular weight: about 290

<Inorganic Filler>

Inorganic filler 1: Boron nitride aggregated particles having a card-house structure, which was produced in accordance with the method for producing boron nitride aggregated particles disclosed in Examples of WO 2015/561028

New Mohs hardness: 2

Volume-average particle size: 45 μm

Inorganic filler 2: Spherical alumina particles produced by Admatechs Co., Ltd.

New Mohs hardness: 9

Volume-average particle size: 6.5 μm

Thermal conductivity: 20 to 30 W/m·K

<Curing Agent>

Curing agent 1: "MEH-8000H" produced by Meiwa Plastic Industries, Ltd.

Phenolic resin-type curing agent

<Curing Catalyst>

Curing catalyst 1: "2E4MZ-A" produced by Shikoku Chemicals Corporation 2,4-Diamino-6-[2'-ethyl-4'-methylimidazolyl-(17')]-ethyl-s-triazine (compound including a triazine ring as a heterocyclic structure including a nitrogen atom)

Molecular weight: 247

Curing catalyst 2: "C11Z-CN" produced by Shikoku Chemicals Corporation

1-Cyanoethyl-2-undecylimidazole

Molecular weight: 275

[Preparation of Sample, Measurement, and Evaluation]

The method for preparing a molded body in Examples and Comparative examples, measurement conditions, and evaluation methods are as described below.

Example 1

A mixture was prepared using a planetary centrifugal mixer such that the proportion of the inorganic filler 1 in the solid component was 51% by weight, the proportion of the inorganic filler 2 in the solid component was 20% by weight, and the proportion of the component other than the inorganic fillers in the solid component was 29% by weight. The breakdown of the proportion of the component other than the inorganic fillers in the solid component was adjusted such that the weight ratios described in the column of Example 1 in Table 1 were achieved. In the preparation of the mixture, methyl ethyl ketone and cyclohexanone were used in equal amounts such that the content of the mixture in the coating slurry was 63% by weight (solid component concentration).

The slurry-like resin composition (slurry for sheet) was applied to a PET base material by doctor blading. After heating had been performed at 60° C. for 120 minutes to perform drying, pressing was performed at 42° C. and 147 MPa for 10 minutes. Hereby, a sheet-like resin composition having a thickness of 150 μm was prepared. The total content of methyl ethyl ketone and cyclohexanone in the sheet-like resin composition was 1% by weight or less.

The sheet-like resin composition was interposed between a copper plate having a thickness of 500 μm and a copper plate having a thickness of 2,000 μm the surfaces of which had been roughened 100 times with a #120 file. Subsequently, pressing was performed at 120° C. and 9.8 MPa for 30 minutes. Then, the temperature was increased. Subsequently, pressing was performed at 175° C. and 9.8 MPa for 30 minutes.

The resulting composite molded body including the copper plates and the resin cured product was etched by a predetermined method to pattern the copper plate having a thickness of 500 μm. The copper plate was patterned such that a circular pattern having a diameter of 25 mm was left at 2 positions.

Examples 2 and 3 and Comparative Examples 1 to 4

A mixture was prepared in accordance with the method used in Example 1 such that the proportion of the inorganic filler 1 in the solid component was 51% by weight, the proportion of the inorganic filler 2 in the solid component was 20% by weight, and the proportion of the component other than the inorganic fillers in the solid component was 29% by weight. A sheet-like resin composition and a composite molded body including copper plates and a resin cured product were prepared as in Example 1, except that the breakdown of the proportion of the component other than the inorganic fillers in the solid component was adjusted such that the weight ratios described in Table 1 were achieved.

<Dielectric Breakdown Voltages (BDV) Before and After Moisture-Absorption Reflow Test>
<BDV Before Moisture-Absorption Reflow Test>

A specific one of the composite molded bodies prepared in Examples and Comparative examples was immersed in Fluorinert FC-40 (produced by The 3M Company). Using High Withstanding Voltage Tester 7470 (produced by Keisoku Giken Co., Ltd.), a voltage of 0.5 kV was applied across electrodes placed on the patterned copper portions having a diameter of 25 mm. The voltage applied was increased by 0.5 kV at intervals of 60 seconds. The measurement was continued until dielectric breakdown occurred. A composite molded body having a BDV of 5 kV or more was subjected to the measurement of BDV after the moisture-absorption reflow test, while a composite molded body having a BDV of less than 5 kV (N.D.) was not subjected to the measurement of BDV after the moisture-absorption reflow test.

<BDV after Moisture-Absorption Reflow Test>

A specific one of the composite molded bodies prepared in Examples and Comparative examples was stored at 85° C. and 85% RH for 3 days using a thermo-hygrostat SH-221 (produced by ESPEC CORP.). Then, 30 minutes or less after the storage, the composite molded body was placed in a nitrogen atmosphere and heated from room temperature to 290° C. over 12 minutes. After the composite molded body had been held at 290° C. for 10 minutes, it was cooled to room temperature (moisture-absorption reflow test). Then, dielectric breakdown voltage was measured as described above. A composite molded body having a BDV of 5 kV or more was denoted as "Good", while a composite molded body having a BDV of less than 5 kV was denoted as "Poor".

<Interfacial Detachment after Moisture-Absorption Reflow Test>

A specific one of the composite molded bodies prepared in Examples and Comparative examples was subjected to the moisture-absorption reflow test as described above. Subsequently, the interface between the copper plate and the sheet-like resin cured product was observed with an ultrasonic imaging device FinSAT (FS300III) (produced by Hitachi Power Solutions Co., Ltd.). In the measurement, a probe having a frequency of 50 MHz was used. The measurement was conducted at a gain of 30 dB and a pitch of 0.2 mm while the sample was placed in water. When the occurrence of detachment at the interface was not confirmed, the sample was denoted as "Good". When the interfacial detachment was confirmed, the sample was denoted as "Poor".

<Increase in Weight of Resin Cured Product>

A specific one of the sheet-like resin cured products prepared in Examples and Comparative examples was cut into a specimen having a size of 6 cm×7 cm, which was then dried at 150° C. for 1 hour. Subsequently, the weight "a" of the specimen was measured. The sheet-like resin cured product was subsequently stored at 85° C. and 85% RH for a predetermined amount of time using a thermo-hygrostat SH-221 (produced by ESPEC CORP.). The weight of the sheet-like resin cured product was measured over time. The sheet-like resin cured product was stored until the weight thereof reached a predetermined weight (constant weight) "b". The weight increase was calculated using the following formula.

$$\text{Weight increase (\%)} = (b-a)/a \times 100$$

<Storage Modulus of Resin Composition Excluding Inorganic Filler>

A resin composition was prepared using a planetary centrifugal mixer as in a corresponding one of Examples and Comparative examples, except that the inorganic fillers were not used. After the resin composition had been heated to dry, the resin composition that had not been cured was heated to cure with a rheometer "MCR302" produced by Anton Paar. Subsequently, the storage modulus of the cured product at 200° C. was measured.

In the measurement, aluminum parallel plates were used. The measurement was conducted at a strain of 0.3%, a frequency of 1 Hz, and a gap of 0.5 mm.

In the heat curing, the temperature profile started from 25° C., was increased to 120° C. at 14° C./min, was maintained at 120° C. for 30 minutes after reaching 120° C., was then increased to 175° C. at 7° C./min, was maintained at 175° C. for 30 minutes after reaching 175° C., was further increased to 200° C. at 7° C./min, and was maintained at 200° C. for 10 minutes after reaching 200° C. The storage modulus of the sample measured while the sample was maintained at 200° C. for 10 minutes was used for evaluation.

Table 1 describes the results of the measurements and evaluations.

TABLE 1

|  |  | Example 1 | Example 2 | Example 3 | Comparative example 1 | Comparative example 2 | Comparative example 3 | Comparative example 4 |
|---|---|---|---|---|---|---|---|---|
| Weight ratio in resin | Resin component 1 | 25 | 25 |  |  |  |  | 20 |
|  | Resin component 2 |  |  | 27 |  |  |  |  |

TABLE 1-continued

| | | Example 1 | Example 2 | Example 3 | Comparative example 1 | Comparative example 2 | Comparative example 3 | Comparative example 4 |
|---|---|---|---|---|---|---|---|---|
| composition excluding inorganic filler | Resin component 3 | | | | 31 | 31 | 31 | |
| | Resin component 4 | 25 | 30 | 48 | | | | 57 |
| | Resin component 5 | 23 | 28 | 23 | | | 30 | |
| | Resin component 6 | | | | 38 | 38 | | |
| | Resin component 7 | | | | 9 | 9 | 9 | |
| | Curing agent | 26 | 16 | | 20 | 20 | 28 | 22 |
| | Curing catalyst 1 | 1.5 | 1.5 | 1.5 | | 1.5 | 1.5 | 1.5 |
| | Curing catalyst 2 | | | | 1.7 | | | |
| Physical properties and evaluation results | Storage modilus (200° C.) [Pa] | $1.8 \times 10^7$ | $3.6 \times 10^7$ | $2.7 \times 10^7$ | $5.4 \times 10^6$ | $7.0 \times 10^6$ | $2.2 \times 10^7$ | $9.1 \times 10^6$ |
| | Weight increase during 85° C.-85% storage [%] | 0.54 | 0.65 | 0.74 | 0.49 | 0.52 | 0.84 | 0.4 |
| | BDV after moisture absorption reflow test | Good | Good | Good | N.D. | Poor | Poor | Poor |
| | Interfacial detachment after moisture absorption reflow test | Good | Good | Good | Poor | Good | Good | Good |

The results described in Table 1 confirm that the resin cured product according to the present invention has excellent voltage resistance under the high-temperature high-humidity condition. Furthermore, in the case where the resin cured product according to the present invention is combined with a metal to form a composite molded body, interfacial detachment does not occur under the high-temperature high-humidity condition.

Although the present invention has been described in detail with reference to particular embodiments, it is apparent to a person skilled in the art that various modifications can be made therein without departing from the spirit and scope of the present invention.

The present application is based on Japanese Patent Application No. 2018-192691 filed on Oct. 11, 2018, which is incorporated herein by reference in its entirety.

The invention claimed is:

1. A resin composition comprising a resin and an aggregated inorganic filler,
    wherein the resin comprises a multifunctional epoxy resin including four or more epoxy groups per molecule,
    wherein the multifunctional epoxy resin has a molecular weight of 600 or less,
    wherein the resin comprises a specific epoxy resin having a biphenyl structure, and a weight-average molecular weight of 10,000 or more,
    wherein the specific epoxy resin is 1% by weight or more and 50% by weight or less relative to 100% by weight of a solid content in the resin composition excluding the aggregated inorganic filler,
    wherein the biphenyl structure is represented by Structural Formula (3) below

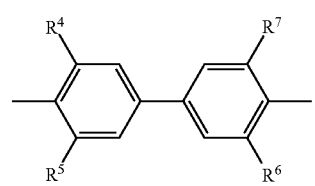

(3)

wherein $R^4$ to $R^7$ each independently represent an alkyl group having a molecular weight of 15 to 1,000, or an aryl group having a molecular weight of 15 to 1,000,
    wherein a dielectric breakdown voltage (BDV) of a cured product of the resin composition after a moisture absorption reflow test is 5 kV or more,
    wherein an increase in a weight of a cured product of the resin composition at 85° C. and 85% RH is 0.80% or less, and
    wherein a storage modulus of a cured product of the resin composition excluding the inorganic filler at 200° C. is $1.0 \times 10^7$ Pa or more.

2. The resin composition according to claim 1, wherein the specific epoxy resin further includes at least one structure selected from a structure represented by Structural Formula (1) below and a structure represented by Structural Formula (2) below

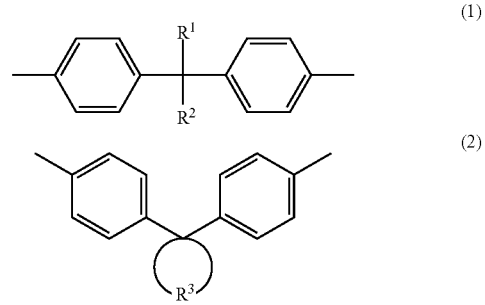

wherein, in Formula (1), $R^1$ and $R^2$ each independently represent an alkyl group having a molecular weight of 16 to 1,000, or an aryl group having a molecular weight of 16 to 1,000, or one of $R^1$ and $R^2$ represents a hydrogen or an alkyl group having a molecular weight of 15 or less, and the other represents an alkyl group having a molecular weight of 16 to 1,000, or an aryl group having a molecular weight of 16 to 1,000,
    in Formula (2), $R^3$ represents a divalent aromatic ring structure having 6 to 100 carbon atoms, or a divalent aliphatic ring structure having 2 to 100 carbon atoms.

3. The resin composition according to claim 1, wherein a content of the multifunctional epoxy resin is 10% by weight or more and 50% by weight or less relative to 100% by weight of a solid content in the resin composition excluding the aggregated inorganic filler.

4. The resin composition according to claim 1, further comprising a compound having a heterocyclic structure including a nitrogen atom.

5. The resin composition according to claim 1, wherein the aggregated inorganic filler includes boron nitride aggregated particles.

6. The resin composition according to claim 5, wherein the boron nitride aggregated particles have a card-house structure.

7. The resin composition according to claim 2, wherein in Formula (2), $R^3$ is represented by Structural Formula (4) below

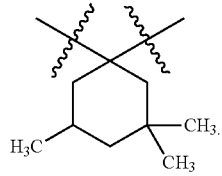

(4)

8. The resin composition according to claim 1, wherein the biphenyl structure is represented by Structural Formula (3) below

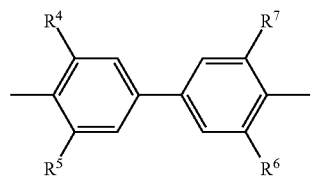

(3)

wherein $R^4$ to $R^7$ each represent a methyl group.

9. A composite molded body comprising a cured product part and a metal part, the cured product part including a cured product of the resin composition according to claim 1.

10. A semiconductor device comprising the composite molded body according to claim 9.

* * * * *